(12) United States Patent
Nishi

(10) Patent No.: US 11,877,499 B2
(45) Date of Patent: Jan. 16, 2024

(54) VAPOR DEPOSITION MASK, MANUFACTURING METHOD FOR VAPOR DEPOSITION MASK, AND MANUFACTURING METHOD FOR DISPLAY DEVICE

(71) Applicant: TOPPAN PRINTING CO., LTD., Tokyo (JP)

(72) Inventor: Takehiro Nishi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 232 days.

(21) Appl. No.: 16/840,260

(22) Filed: Apr. 3, 2020

(65) Prior Publication Data

US 2020/0235298 A1 Jul. 23, 2020

Related U.S. Application Data

(63) Continuation of application No. PCT/JP2018/038126, filed on Oct. 12, 2018.

(30) Foreign Application Priority Data

Oct. 13, 2017 (JP) ................ 2017-199919

(51) Int. Cl.
*C23C 14/04* (2006.01)
*C23C 14/24* (2006.01)
(Continued)

(52) U.S. Cl.
CPC ......... *H10K 71/166* (2023.02); *C23C 14/042* (2013.01); *C23C 14/24* (2013.01); *H05B 33/10* (2013.01); *H10K 71/00* (2023.02)

(58) Field of Classification Search
None
See application file for complete search history.

(56) References Cited

U.S. PATENT DOCUMENTS

2002/0182517 A1* 12/2002 Rueb .................... H01L 21/266
216/2
2016/0122861 A1* 5/2016 Kobayashi .......... H01L 51/0011
118/720
(Continued)

FOREIGN PATENT DOCUMENTS

| CN | 209210911 U | 8/2019 |
| JP | 2003-045657 A | 2/2003 |

(Continued)

OTHER PUBLICATIONS

International Search Report and Written Opinion of PCT International Application No. PCT/JP2018/038126, with translation, 10 pages, search report dated Dec. 4, 2018.
(Continued)

*Primary Examiner* — Jethro M. Pence
(74) *Attorney, Agent, or Firm* — SQUIRE PATTON BOGGS (US) LLP

(57) ABSTRACT

A vapor deposition mask includes a front surface, a back surface opposite to the front surface, and inner surfaces defining the respective mask holes. Each mask hole extends between the front surface and the back surface. In a plan view of the front surface, each mask hole includes a large opening, which is located at the front surface, and a small opening, which is located inside the large opening. At least a section of each mask hole has a shape of an inverted frustum extending between the large opening and the small opening. Each inner surface includes a stepped surface spreading from the small opening toward the large opening.

8 Claims, 10 Drawing Sheets

(51) Int. Cl.
  *B05C 21/00* (2006.01)
  *H10K 71/16* (2023.01)
  *H05B 33/10* (2006.01)
  *H10K 71/00* (2023.01)

(56) References Cited

U.S. PATENT DOCUMENTS

2017/0141315 A1 5/2017 Ikenaga
2019/0106781 A1 4/2019 Sakio et al.
2020/0235298 A1 7/2020 Nishi

FOREIGN PATENT DOCUMENTS

| JP | 2005-105406 A | 4/2005 |
| JP | 2008-088466 A | 4/2008 |
| JP | 2009-041054 A | 2/2009 |
| JP | 2009-052073 A | 3/2009 |
| JP | 2009-074160 A | 4/2009 |
| JP | 2010-216000 A | 9/2010 |
| JP | 2015-168847 A | 9/2015 |
| JP | 2015-214741 A | 12/2015 |
| JP | 2017-88936 A | 5/2017 |
| JP | 2019-507829 A | 3/2019 |
| WO | WO 2017/142231 A1 | 8/2017 |
| WO | WO 2017/168773 A1 | 10/2017 |
| WO | WO 2017/179677 A1 | 10/2017 |

OTHER PUBLICATIONS

First Office Action dated Dec. 3, 2021 for Chinese Patent Application No. 201880065736.3, with English translation, 15 pages.

* cited by examiner

VAPOR DEPOSITION MASK, MANUFACTURING METHOD FOR VAPOR DEPOSITION MASK, AND MANUFACTURING METHOD FOR DISPLAY DEVICE

BACKGROUND

The present disclosure relates to a vapor deposition mask, a method for manufacturing a vapor deposition mask, and a method for manufacturing a display device using a vapor deposition mask.

Display devices that are produced by vapor deposition include organic EL displays. Organic EL displays have patterns formed of deposits of vapor deposition particles sublimed in the vapor deposition process. The vapor deposition mask used in the vapor deposition process has a front surface, a back surface, and mask holes extending through the vapor deposition mask from the front surface to the back surface. The mask holes are passages for the sublimated vapor deposition particles.

The back surface of the vapor deposition mask is brought into contact with a vapor deposition target on which a pattern is formed in the vapor deposition process. The front surface of the vapor deposition mask faces the vapor deposition source in the vapor deposition process. Each mask hole includes a front surface opening at the front surface and a back surface opening at the back surface. The front surface opening is included in a large hole tapering from the front surface toward the back surface. The back surface opening is included in a small hole tapering from the back surface toward the front surface. The large hole connects to the small hole at a position closer to the back surface than the midpoint of the thickness of the vapor deposition mask in the thickness direction of the vapor deposition mask. The section where the large hole connects to the small hole is referred to as a connection section. In the cross-section taken along the thickness direction of the vapor deposition mask and passing through the connection section, a straight line parallel to the back surface is referred to as a reference line. In this cross-section, a straight line passing through the edge of the front surface opening and the connection section is referred to as an oblique line. The oblique line and the reference line form a taper angle (see Japanese Laid-Open Patent Publication No. 2017-88936, for example).

The angle formed by the trajectory of the vapor deposition particles traveling from the vapor deposition source to the vapor deposition mask and the back surface of the vapor deposition mask is referred to as an incident angle of the vapor deposition particles. The taper angle limits the range of incident angles at which the sublimated vapor deposition particles can pass through the large hole and also the incident angles at which the vapor deposition particles can pass through the mask hole. As such, there is a need for a vapor deposition mask that reduces limitations on the incident angle at which the vapor deposition particles can pass through the large hole.

SUMMARY

It is an objective of the present disclosure to provide a vapor deposition mask, a method for manufacturing a vapor deposition mask, and a method for manufacturing a display device that reduce limitations on the incident angle at which the vapor deposition particles can pass through the mask hole.

To achieve the foregoing objective, a vapor deposition mask including a metal plate and a plurality of mask holes in the metal plate is provided. The vapor deposition mask includes a front surface, a back surface opposite to the front surface, and inner surfaces defining the respective mask holes. Each mask hole extends between the front surface and the back surface. In a plan view of the front surface, each mask hole includes a large opening, which is located at the front surface, and a small opening, which is located inside the large opening. At least a section of each mask hole has a shape of an inverted frustum extending between the large opening and the small opening. Each inner surface includes a stepped surface spreading from the small opening toward the large opening.

To achieve the foregoing objective, a method for manufacturing a vapor deposition mask including a metal plate and a plurality of mask holes in the metal plate is provided. The method includes forming a vapor deposition mask by forming a plurality of mask holes in the metal plate. The vapor deposition mask includes a front surface, a back surface opposite to the front surface, and inner surfaces defining the respective mask holes. Each mask hole extends between the front surface and the back surface. In a plan view of the front surface, each mask hole includes a large opening, which is located at the front surface, and a small opening, which is located inside the large opening. At least a section of each mask hole has a shape of an inverted frustum extending between the large opening and the small opening. Each inner surface includes a stepped surface spreading from the small opening toward the large opening.

With this configuration, the stepped surface, which spreads, enlarges the edge of the large opening, allowing the taper angle to be smaller than that of a mask hole without the stepped surface. This reduces limitations on the incident angle of vapor deposition particles at which the vapor deposition particles can pass through the mask hole.

In the above-described vapor deposition mask, each large opening may have an edge that includes a first section, which is an edge of the stepped surface, and a second section, which is a section other than the first section. The second section of the edge of each large opening may include a boundary that coincides with the second section of one of the large openings that is adjacent to the large opening. The boundary may be recessed from the front surface.

In this configuration, the boundary in the edge of the large opening is recessed from the front surface. This allows the section of the inner surface of the mask hole other than the stepped section to have a smaller taper angle than a configuration without the boundary.

In the above-described vapor deposition mask, in a plan view of the front surface, each boundary may include a section around a corresponding one of the small openings where a distance between the corresponding small opening and an adjacent one of the small openings is smallest.

With this configuration, in a section where the distance between adjacent small openings is smallest, the boundary provides a taper angle. In a section where the distance between adjacent small openings is larger, the stepped surface provides a small taper angle. Thus, a small taper angle is achievable even in a design with a greater distance between adjacent small openings.

In the above-described vapor deposition mask, each large opening may have an edge that includes a first section, which is an edge of the stepped surface, and a second section, which is a section other than the first section. The first section of the edge of each large opening may include a boundary that coincides with the first section of one of the large openings that is adjacent to the large opening. The boundary may be recessed from the front surface.

In this configuration, the boundary in the edge of the large opening is recessed from the front surface. This allows the taper angle to be smaller than that of a configuration without the boundary.

In the above-describe vapor deposition mask, each small opening may be located at the back surface. In this configuration, since each small opening is located at the back surface, the processing from the large opening to the small opening can be performed from the front surface.

In the above-described vapor deposition mask, each stepped surface may include a plurality of steps. Each step may be arcuate as viewed in a cross-section orthogonal to the front surface. This configuration is suitable for forming the steps by wet etching.

To achieve the foregoing objective, a vapor deposition mask including a metal plate and a plurality of mask holes in the metal plate is provided. The vapor deposition mask includes a front surface and a back surface opposite to the front surface. Each mask hole extends between the front surface and the back surface. In a plan view of the front surface, each mask hole includes a large opening, which is located at the front surface, and a small opening, which is located inside the large opening. At least a section of each mask hole has a shape of an inverted frustum extending between the large opening and the small opening. Adjacent ones of the large openings are connected to each other by an auxiliary recess, which is recessed from the front surface.

In this configuration, a part of the edge of the large opening is connected to the auxiliary recess and thus recessed from the front surface. This allows the taper angle to be smaller than that of a mask hole without the auxiliary recess. This reduces limitations on the incident angle of vapor deposition particles at which the vapor deposition particles can pass through the mask hole.

DESCRIPTION OF EXEMPLARY EMBODIMENTS

Referring to FIGS. 1 to 17, embodiments of a vapor deposition mask, a method for manufacturing a vapor deposition mask, and a method for manufacturing a display device are now described. In the following descriptions, the structure of a mask device, the structure of a vapor deposition mask, a method for manufacturing a vapor deposition mask, and examples are explained in this order.

[Structure of Mask Device]

Figure 1:
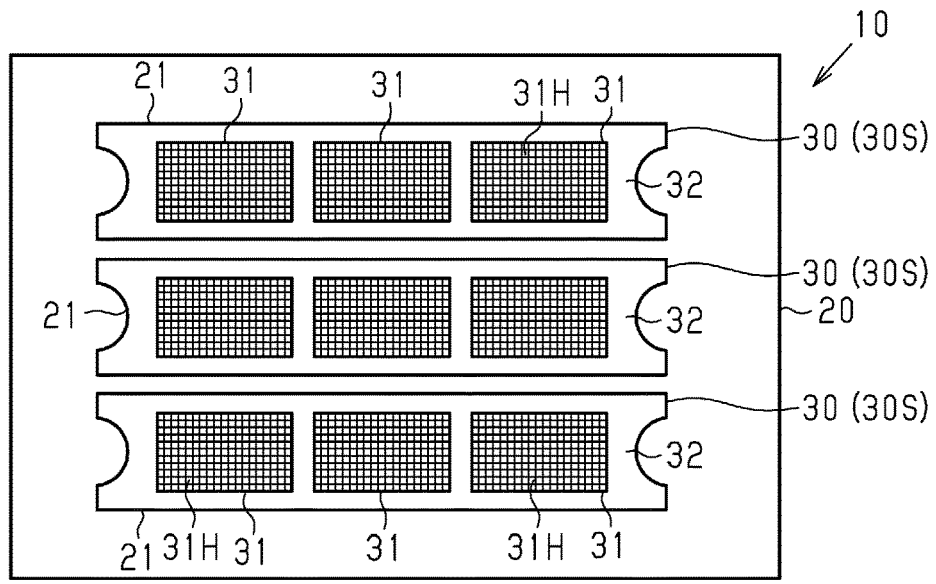
FIG. 1 is a plan view showing the structure of a mask device according to one embodiment.

As shown in FIG. 1, a mask device 10 includes a main frame 20 and vapor deposition masks 30. The main frame 20 has a rectangular frame shape for supporting the vapor deposition masks 30. The main frame 20 is attached to a vapor deposition apparatus for performing vapor deposition. The main frame 20 has main frame holes 21, which are equal in number to the vapor deposition masks 30. Each main frame hole 21 extends through the main frame 20 in substantially the entire area where a vapor deposition mask 30 is placed. The vapor deposition mask 30 has the shape of a planar strip and includes mask portions 31 and an outer section 32 surrounding the mask portions 31. Each mask portion 31 has mask holes 31H. The outer section 32 is free of mask holes 31H.

The vapor deposition mask 30 consists of a mask sheet 30S. The mask sheet 30S may be a single metal sheet or a multilayer metal sheet. The metal sheet forming the mask sheet 30S is made of an iron-nickel alloy. The material of the metal sheet may be an iron-nickel alloy containing at least 30 mass % of nickel. Among iron-nickel alloys, Invar, which is an alloy mainly composed of an alloy containing 36 mass % nickel and 64 mass % iron, is preferably used for the metal sheet. When the principal component of the metal sheet is the alloy of 36 mass % of nickel and 64 mass % of iron, the remainder of the metal sheet may contain additives such as chromium, manganese, carbon, and cobalt.

When the mask sheet 30S is an Invar sheet, the mask sheet 30S has a thermal expansion coefficient of about $1.2 \times 10^{-6}/°$ C., for example. The mask sheet 30S having such a thermal expansion coefficient allows the degree of thermal expansion of the mask portion 31 to match that of the glass substrate. Thus, a glass substrate may be suitably used as the target of vapor deposition performed using the mask device 10. The mask sheet 30S may have a thickness of between 10 μm and 50 μm inclusive.

In the example shown in FIG. 1, each vapor deposition mask 30 is entirely located inside the edge of the main frame 20. However, each end of the vapor deposition mask 30 in the direction in which the mask portions 31 are arranged may extend outward beyond the edge of the main frame 20.

[Structure of Vapor Deposition Mask]

Referring to FIGS. 2 to 10, the structure of a vapor deposition mask 30 is now described. Specifically, the structure of a first example of a vapor deposition mask 30 and the structure of a second example of a vapor deposition mask 30 are described. The first example of a vapor deposition mask 30 differs from the second example of a vapor deposition mask 30 in the shape of the mask holes 31H in the mask portions 31.

[First Example]

Figure 2:
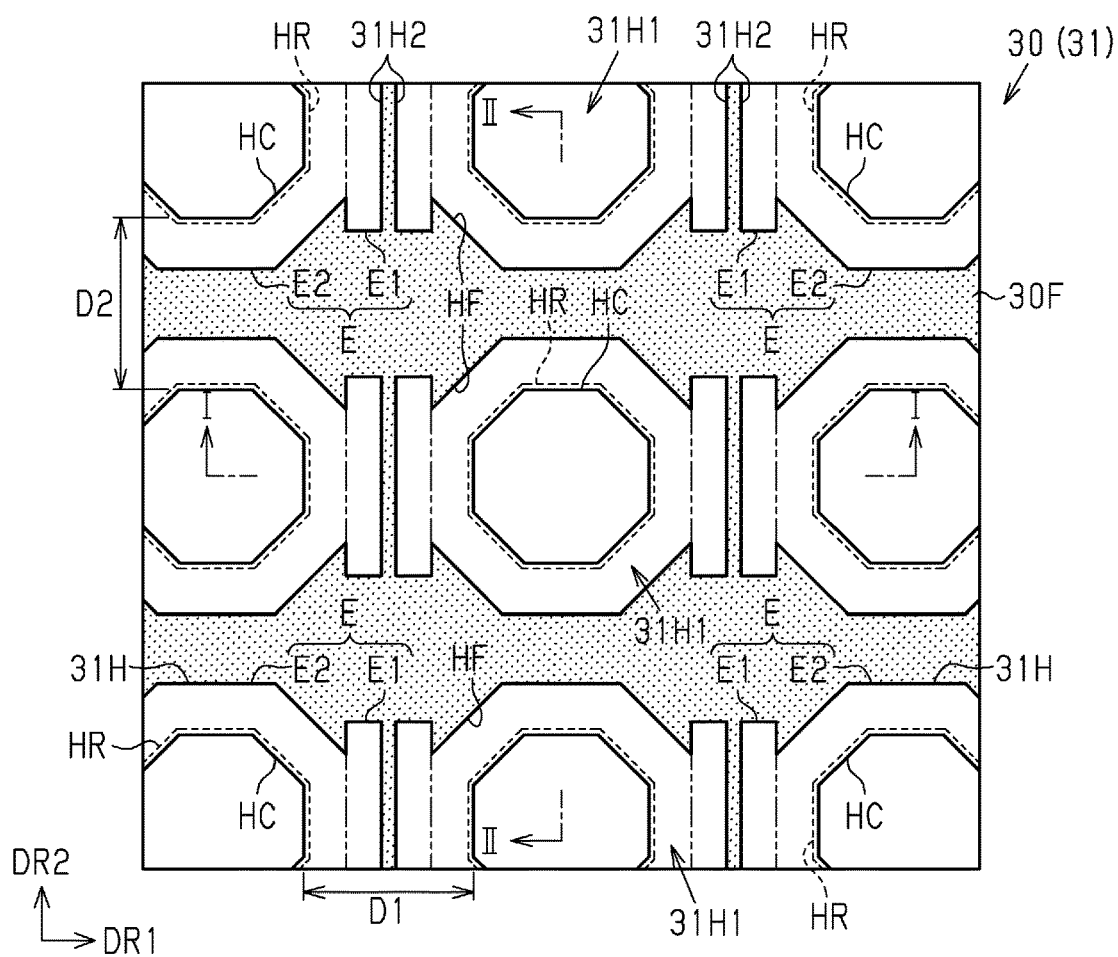
FIG. 2 is a plan view showing the mask front surface of a first example of a vapor deposition mask.
Figure 3:
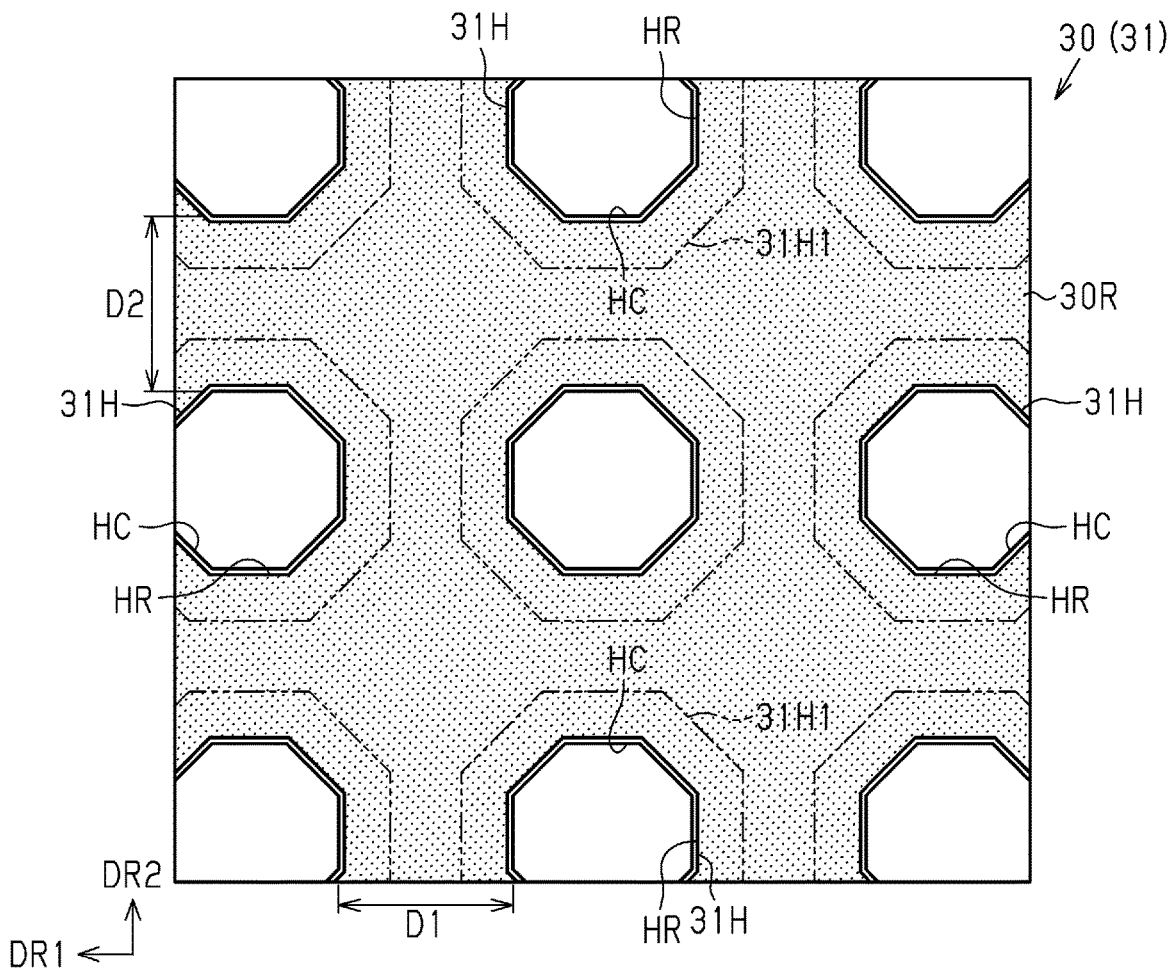
FIG. 3 is a plan view showing the structure of the mask back surface of the first example of a vapor deposition mask.

Referring to FIGS. 2 to 6, the first example of a vapor deposition mask 30 is now described. FIG. 2 shows the structure of a mask portion 31 as viewed in a plan view of the mask front surface. FIG. 3 shows the structure of the mask portion 31 as viewed in a plan view of the mask back surface. In FIGS. 2 and 3, for easier distinction between the mask holes 31H and the sections free of the mask holes 31H in the mask front and back surfaces, the sections free of the mask holes 31H are dotted.

Referring to FIG. 2, the vapor deposition mask 30 includes a mask front surface 30F and a mask back surface, which is opposite to the mask front surface 30F. Each mask portion 31 has mask holes 31H extending between the mask front surface 30F and the mask back surface 30R. Each mask hole 31H includes a front surface opening HF located at the mask front surface 30F and a central opening HC located inside the front surface opening HF as viewed in a plan view of the mask front surface 30F. The front surface opening HF is an example of a large opening, and the central opening HC is an example of a small opening. The inner surface defining the mask hole 31H has stepped surfaces connecting the front surface opening HF to the central opening HC. The edge E of each front surface opening HF includes first sections E1, which are edges of the stepped surfaces, and second sections E2, which are the sections of the edge E other than the first sections E1.

In the present embodiment, the mask holes 31H are arranged along a first direction DR1 and a second direction DR2, which is orthogonal to the first direction DR1. Each mask hole 31H is spaced apart from the mask holes 31H that are adjacent in the first direction DR1 and also from the mask holes 31H that are adjacent in the second direction DR2. Each mask hole 31H has one main hole 31H1 and two auxiliary recesses 31H2. The main hole 31H1 is located between the two auxiliary recesses 31H2 in the first direction DR1. In other words, two auxiliary recesses 31H2 are located between main holes 31H1 that are adjacent in the first direction DR1.

The sections of each mask hole 31H where the main hole 31H1 connects to the auxiliary recesses 31H2 are recessed from the mask front surface 30F. The surface defining the main hole 31H1 and the surface defining each auxiliary recess 31H2 form a step such that the edge of the front surface opening HF is enlarged. As such, the edge E of each front surface opening HF consists of the edge of the main hole 31H1, which is an example of the second section E2, and the edge of each auxiliary recess 31H2, which is an example of the first section E1.

In a plan view of the mask front surface 30F, the distance between central openings HC adjacent to each other in the first direction DR1 is a first distance D1, and the distance between central openings HC adjacent to each other in the second direction DR2 is a second distance D2. The first distance D1 is substantially equal to the second distance D2.

In a plan view of the mask front surface 30F, each front surface opening HF substantially has a regular octagonal shape. In the front surface opening HF, the maximum value of the length in the first direction DR1 is substantially equal to the maximum value of the length in the second direction DR2. In a plan view of the mask front surface 30F, the front surface opening HF may have a polygonal shape other than a regular octagonal shape. The front surface opening HF preferably has the shape of a polygon with 2n vertices (n is an integer greater than or equal to 2). In a plan view of the mask front surface 30F, each vertex or side of the front surface opening HF may have a curvature.

In a plan view of the mask front surface 30F, the two auxiliary recesses 31H2 have substantially the same shape and size. Each auxiliary recess 31H2 has the shape of a rectangle extending in the second direction DR2. In a plan view of the mask front surface 30F, the two auxiliary recesses 31H2 may have different shapes or sizes. The auxiliary recesses 31H2 do not have to be rectangular and may be oval, for example. In addition, in a plan view of the mask front surface 30F, each vertex or side of the auxiliary recess 31H2 may have a curvature.

As shown in FIG. 3, in a plan view of the mask back surface 30R, back surface openings HR are arranged in the first direction DR1 and the second direction DR2. In a plan view of the mask back surface 30R, the back surface openings HR are smaller than the front surface openings HF, and the centers of the back surface openings HR are substantially aligned with the centers of the main holes 31H1 of the respective mask holes 31H. The back surface openings HR substantially have a regular octagonal shape, and the shapes of the back surface openings HR are substantially similar to the shapes of the edges of the main holes 31H1 of the respective mask holes 31H.

Figure 4:
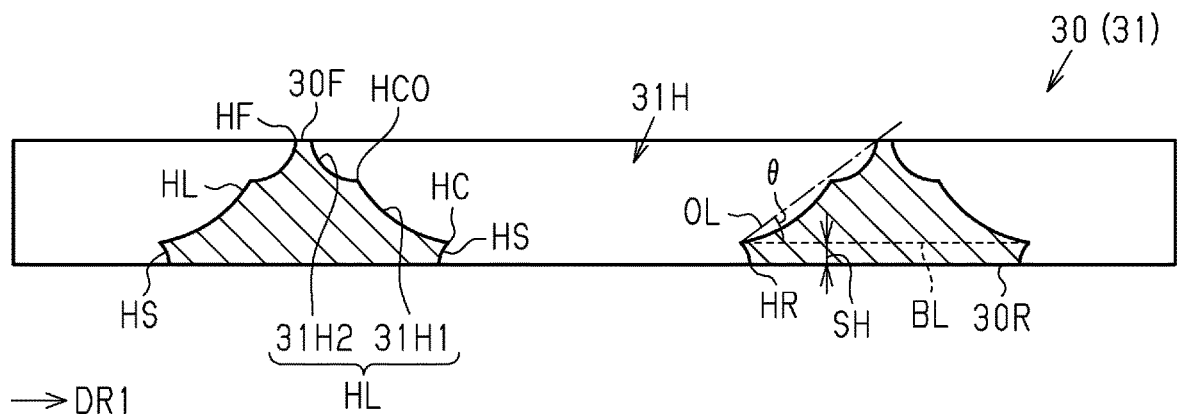
FIG. 4 is a cross-sectional end view taken along line I-I in FIG. 2.

FIG. 4 shows the structure of an end surface taken along line I-I in FIG. 2, that is, an end surface along a plane orthogonal to the mask front surface 30F and extending in the first direction DR1. Line I-I is a straight line that extends in the first direction DR1 and passes through the centers of front surface openings HF arranged in the second direction DR2 in a plan view of the mask front surface 30F.

As shown in FIG. 4, each mask hole 31H has a front surface opening HF located at the mask front surface 30F and a central opening HC located inside the front surface opening HF. A part of the mask hole 31H has the shape of an inverted frustum extending between the front surface opening HF and the central opening HC. The inner surface that defines the mask hole 31H has stepped surfaces spreading from the central opening HC to the front surface opening HF. The inner surface defining each auxiliary recess 31H2 connects to the inner surface defining the main hole 31H1 at a connection section HCO between the central opening HC and the front surface opening HF.

Each mask hole 31H includes a large hole HL and a small hole HS. The large hole HL has the shape of an inverted frustum including the front surface opening HF. The small hole HS has the shape of a frustum including the back surface opening HR. The small hole HS connects to the large hole HL, and the section where the small hole HS connects to the large hole HL is the central opening HC. The large hole HL consists of a main hole 31H1 described above and two auxiliary recesses 31H2. The main hole 31H1 extends between the mask front surface 30F and the central opening HC. The inner surface of the large hole HL includes stepped surfaces, each having two steps and extending partially in the circumferential direction of the mask hole 31H. Each of the stepped surfaces having two steps consists of a part of the inner surface of the main hole 31H1 and the inner surface of the corresponding auxiliary recess 31H2. The distance between the central opening HC and the back surface opening HR is referred to as a step height SH. The step height is preferably less than or equal to 3 µm, more preferably less than or equal to 1 µm.

In a cross-section taken along the thickness direction of the vapor deposition mask 30 and passing through central openings HC, a straight line parallel to the mask back surface 30R is referred to as a reference line BL. In this cross-section, of the straight lines connecting the edge of the central opening HC to one point on the inner surface of the large hole HL, the straight line that forms the largest angle with the reference line BL is referred to as an oblique line OL. In the first example, the oblique line OL is a straight line that passes through the inner surface of the main hole 31H1 and the edge of the front surface opening HF. The angle formed by the reference line BL and the oblique line OL is referred to as a taper angle θ. The oblique line OL may be a straight line connecting the edge of the central opening HC to the connection section HCO.

The mask holes 31H of the vapor deposition mask 30 are typically formed by wet etching. This wet etching proceeds isotropically from the front surface of a metal sheet. Each mask hole 31H formed by wet etching may have the shape of a part of a semicircle with the mask front surface 30F at the base, and the cross-sectional area of the mask hole 31H in a plane parallel to the mask front surface 30F decreases abruptly in size as the mask hole 31H extends from the front surface opening HF. The taper angle θ of the mask hole 31H is smaller when the sheet is thinner, and is substantially determined by the thickness of the sheet. However, there is a limit on the extent to which the sheet can be thinned to reduce the taper angle θ. In this regard, the configuration described above has the stepped surfaces spreading to enlarge the edge E of the front surface opening HF, allowing the taper angle θ to be smaller than that of a mask hole 31H without the stepped surface. This reduces limitations on the incident angle, such as limitations on the incident angle of vapor deposition particles that allows the vapor deposition particles to pass through the mask holes 31H and a section that requires a small incident angle.

Figure 5:
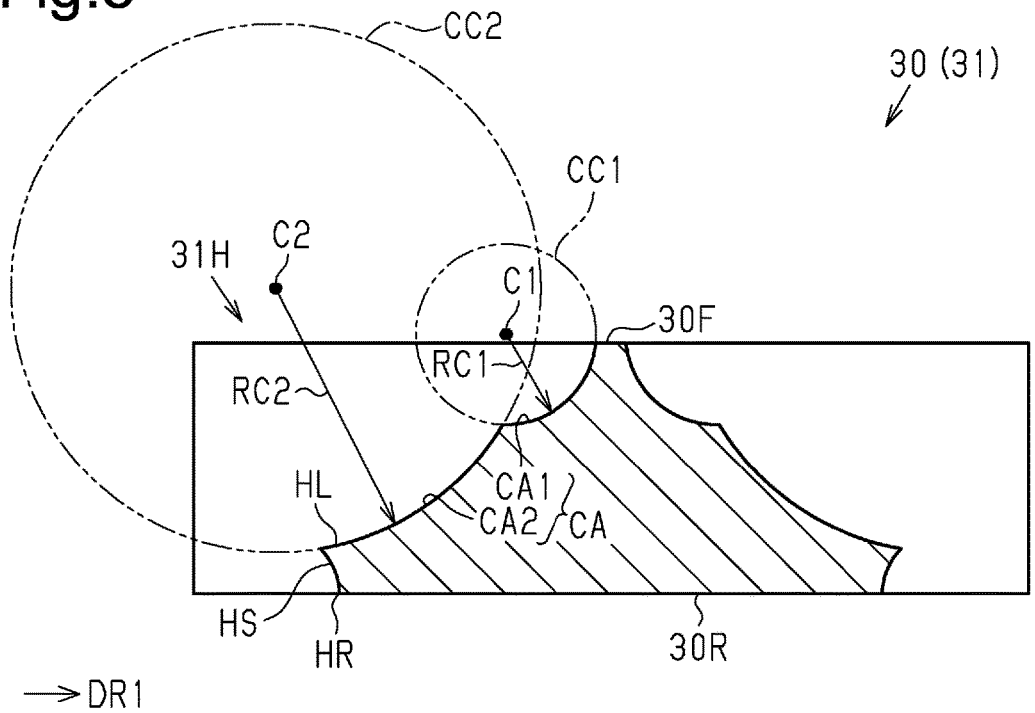
FIG. 5 is an enlarged cross-sectional end view showing a section in FIG. 4.

FIG. 5 is an enlarged view of an example of the end surface structure of the mask holes 31H. In the end surface taken along line I-I, the sections in the side surface defining a mask hole 31H that are located on the opposite sides of the mask hole 31H in the first direction DR1 substantially have the same shape. As such, only one of the two sections is described below, and descriptions on the other are omitted. Further, in the end surface taken along line I-I, the mask element including the side surface defining each large hole HL is symmetrical with respect to the straight line extending parallel to the thickness direction of the vapor deposition mask 30 and passing through the center of the mask element in the first direction DR1.

As shown in FIG. 5, each step of the stepped surface is arcuate as viewed in an end surface along a plane orthogonal to the mask front surface 30F and extending in the first direction DR1, that is, in a cross-section. The stepped surface has a shape suitable for forming each step by wet etching. The inner surface defining the large hole HL includes an arcuate section CA having two arcuate steps. The arcuate section CA includes a first arc CA1 and a second arc CA2. The second arc CA2 is located closer to the mask back surface 30R than the first arc CA1. A first curvature circle CC1 extending along the first arc CA1 has a first center of curvature C1. The radius of curvature of the first curvature circle CC1 is referred to as a first curvature radius RC1. A second curvature circle CC2 extending along the second arc CA2 has a second center of curvature C2. The radius of curvature of the second curvature circle CC2 is referred to as a second curvature radius RC2. The first center of curvature C1 and the second center of curvature C2 are located at the side of the arcuate section CA where the mask hole 31H is located. The first curvature radius RC1 is smaller than the second curvature radius RC2.

Figure 6:
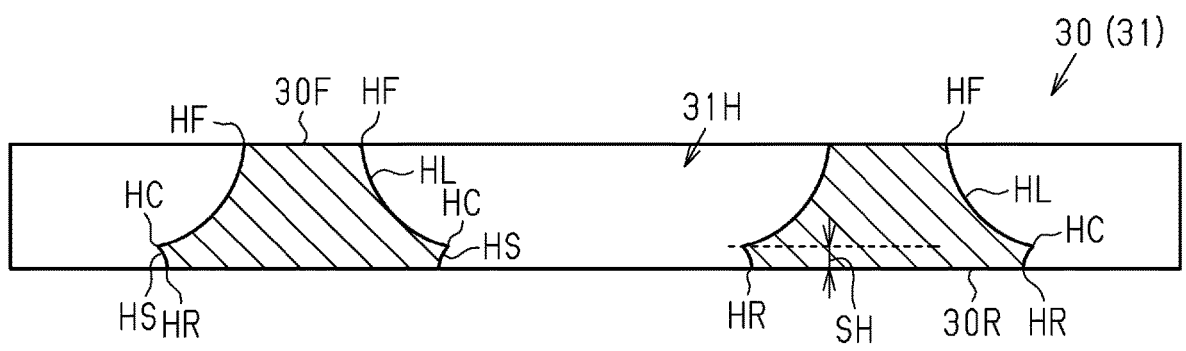
FIG. 6 is a cross-sectional end view taken along line II-II in FIG. 2.

FIG. 6 shows a structure of an end surface taken along line II-II in FIG. 2, that is, an end surface along a plane orthogonal to the mask front surface 30F and extending in the second direction DR2. Line II-II is a straight line that extends in the second direction DR2 and passes through the centers of front surface openings HF arranged in the first direction DR1 in a plan view of the mask front surface 30F.

As shown in FIG. 6, the inner surface defining each large hole HL and the inner surface defining each small hole HS are curved outward of the mask hole 31H as viewed in an end surface along a plane orthogonal to the mask front surface 30F and extending in the second direction DR2, that is, in a cross-section.

In the vapor deposition mask 30, the mask front surface 30F faces the vapor deposition source in a vapor deposition apparatus, and the mask back surface 30R is in contact with a vapor deposition target, such as a glass substrate, in the vapor deposition apparatus. Each mask hole 31H is a passage through which the vapor deposition particles sublimated from the vapor deposition source pass, and the vapor deposition particles sublimated from the vapor deposition source travel in the mask hole 31H from the front surface opening HF to the back surface opening HR. The mask hole 31H having the front surface opening HF that is larger than the back surface opening HR reduces the shadow effect for the vapor deposition particles entering through the front surface opening HF.

[Second Example]

Referring to FIGS. 7 to 10, the second example of a vapor deposition mask 30 is now described.

Figure 7:
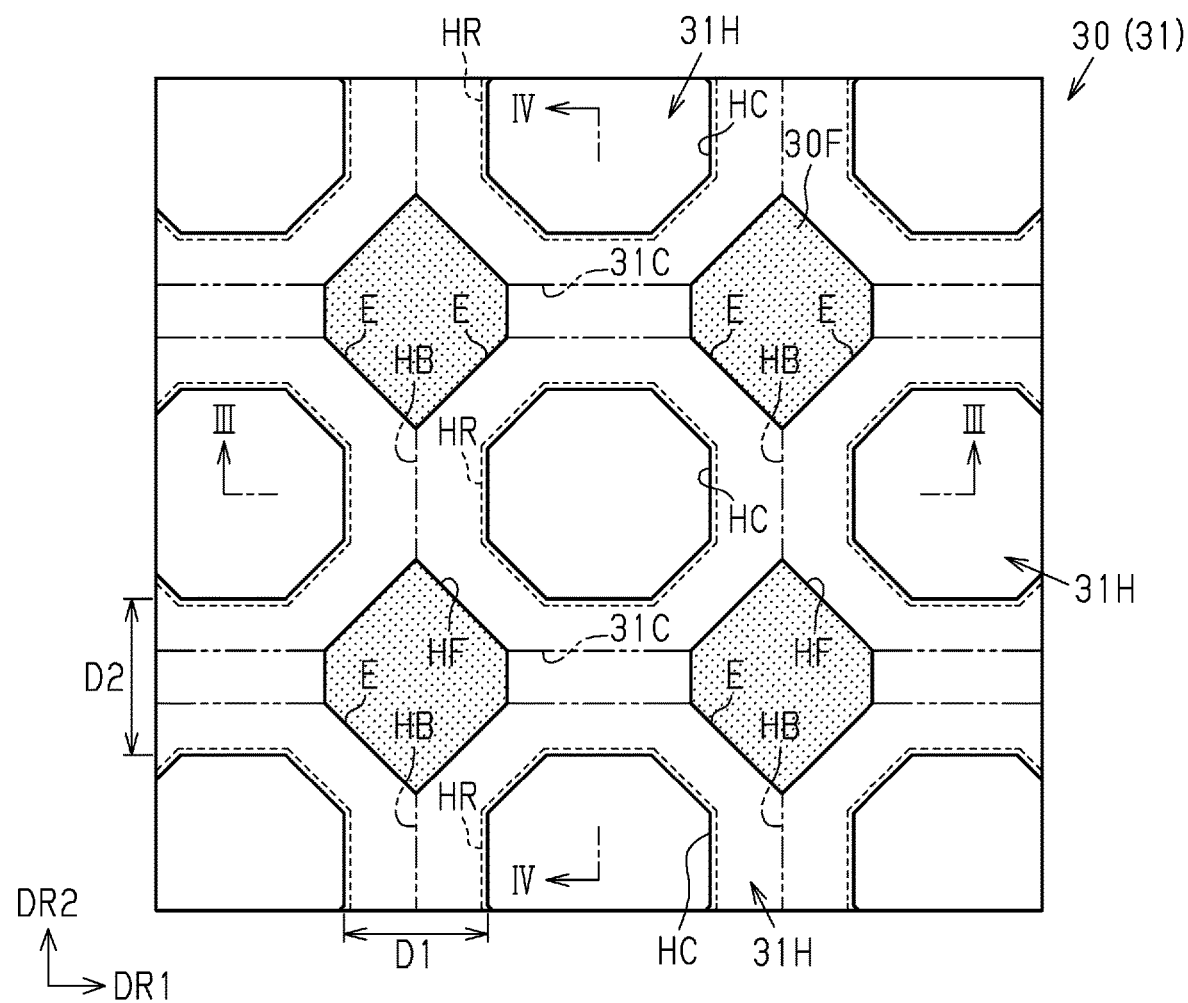
FIG. 7 is a plan view showing the structure of the mask front surface of a second example of a vapor deposition mask.

As shown in FIG. 7, the vapor deposition mask 30 has mask holes 31H. Each mask hole 31H extends between the mask front surface 30F and the mask back surface 30R. Each mask hole 31H includes a front surface opening HF located at the mask front surface 30F and a central opening HC located inside the front surface opening HF as viewed in a plan view of the mask front surface 30F. The front surface opening HF is an example of a large opening, and the central opening HC is an example of a small opening. A part of the mask hole 31H has the shape of an inverted frustum extending between the front surface opening HF and the central opening HC. An auxiliary recess 31C, which is recessed from the mask front surface 30F, connects adjacent front surface openings HF to each other.

The edge E of each front surface opening HF includes a boundary HB that coincides with the edge of another front surface opening HF that is adjacent to the front surface opening HF. The boundary HB is recessed from the mask front surface 30F. The boundary HB includes a section around the central opening HC where the distance between adjacent central openings HC is smallest in a plan view of the mask front surface 30F. As described above, in a plan view of the mask front surface 30F, the distance between central openings HC adjacent to each other in the first direction DR1 is the first distance D1, and the distance between central openings HC adjacent to each other in the second direction DR2 is the second distance D2. In the second example of a vapor deposition mask 30, the first distance D1 is smaller than the second distance D2, and each boundary HB is located between mask holes 31H in the first direction DR1.

In this configuration, each boundary HB in the edge E of the front surface opening HF is recessed from the mask front surface 30F. As such, regions other than the auxiliary recesses 31C can also have a smaller taper angle θ than a configuration without the boundary HB. Further, in a section where the distance between adjacent central openings HC is smallest, the boundary HB provides a taper angle θ. In a section where the distance between adjacent central openings HC is larger, the auxiliary recess 31C provides a small taper angle θ. Thus, a small taper angle θ is achievable even in a design with a greater distance between adjacent central openings HC.

In the present embodiment, the mask holes 31H are arranged in the first direction DR1 and the second direction DR2 and shaped to extend in the first direction DR1 in a plan view of the mask front surface 30F. In a plan view of the mask front surface 30F, one auxiliary recess 31C is located between each two mask holes 31H adjacent to each other in the second direction DR2. Each auxiliary recess 31C connects to the two mask holes 31H located on the opposite sides of the auxiliary recess 31C in the second direction DR2.

In a plan view of the mask front surface 30F, each mask hole 31H has boundaries HB extending partially in the circumferential direction of the mask hole 31H. Each mask hole 31H includes two boundaries HB. Each boundary HB extends linearly in the second direction DR2, and the two boundaries HB are arranged in the first direction DR1. As viewed from the inner side of the mask hole 31H, each boundary HB is a recess recessed from the mask front surface 30F.

In a plan view of the mask front surface 30F, each front surface opening HF substantially has an octagonal shape. In the front surface opening HF, the maximum value of the length in the first direction DR1 is greater than the maximum value of the length in the second direction DR2. As with the front surface opening HF of the first example, the front surface opening HF may have a polygonal shape other than an octagonal shape in a plan view of the mask front surface 30F. The front surface opening HF preferably has the shape of a polygon with 2n vertices (n is an integer greater than or equal to 2). In a plan view of the mask front surface 30F, each vertex or side of the front surface opening HF may have a curvature.

In a plan view of the mask front surface 30F, the auxiliary recesses 31C have substantially the same shape and size. Each auxiliary recess 31C may have the shape of a rectangle extending in the first direction DR1. In a plan view of the mask front surface 30F, the auxiliary recesses 31C may have different shapes or sizes. The auxiliary recesses 31C do not have to be rectangular and may be oval, for example. In a plan view of the mask front surface 30F, each vertex or side of the auxiliary recess 31C may have a curvature.

Figure 8:
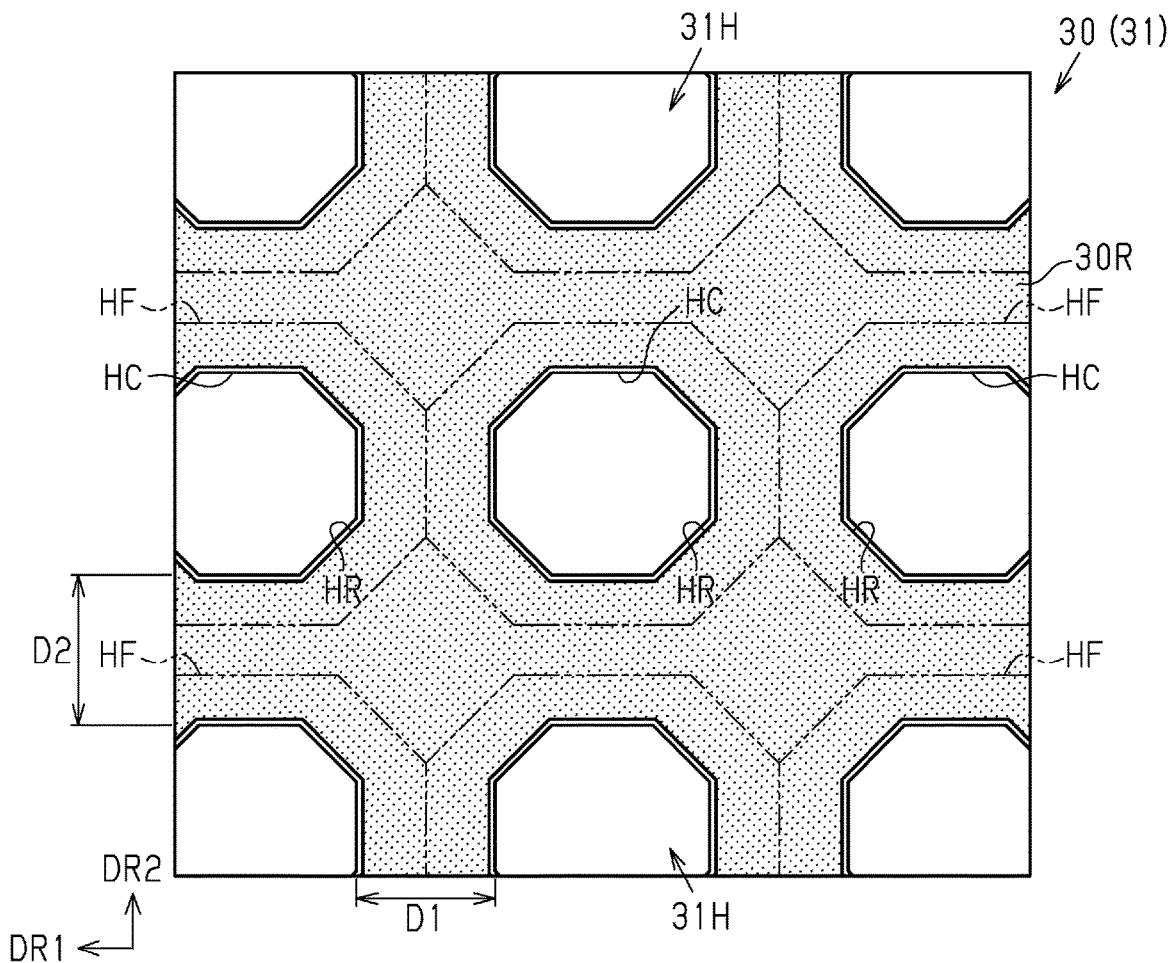
FIG. 8 is a plan view showing the structure of the mask back surface of the second example of a vapor deposition mask.

As shown in FIG. 8, the back surface openings HR is arranged in the first direction DR1 and the second direction DR2. The centers of the back surface openings HR are substantially aligned with the centers of the front surface openings HF of the respective mask holes 31H. The back surface openings HR substantially have an octagonal shape extending in the first direction DR1, and the shapes of the back surface openings HR are substantially similar to the shapes of the front surface openings HF of the respective mask holes 31H.

Figure 9:
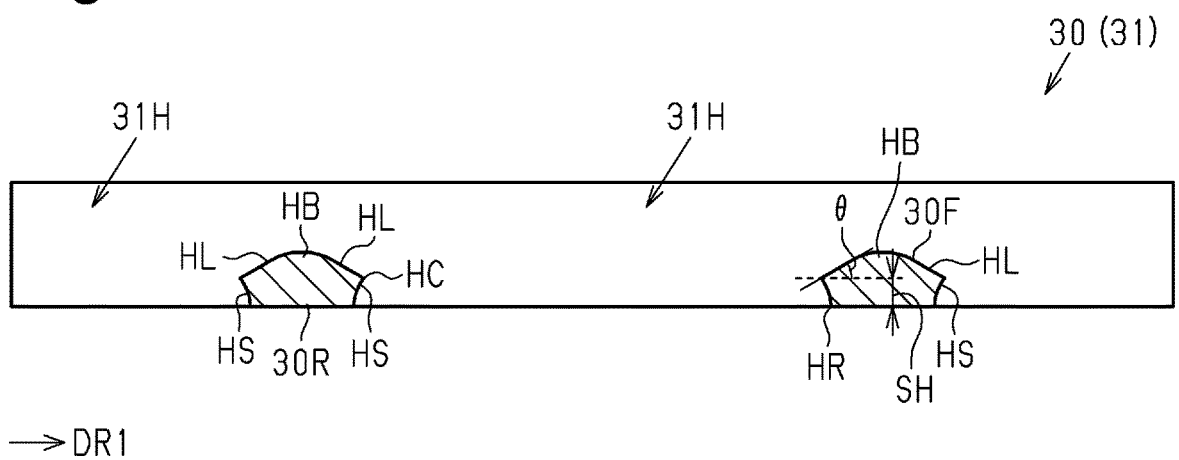
FIG. 9 is a cross-sectional end view taken along line III-III in FIG. 7.

FIG. 9 shows the structure as viewed in an end surface taken along line in FIG. 7, that is, an end surface along a plane orthogonal to the mask front surface 30F and extending in the first direction DR1. In a plan view of the mask front surface 30F, line III-III is a straight line that extends in the first direction DR1 and passes through the centers of front surface openings HF arranged in the second direction DR2.

As shown in FIG. 9, each mask hole 31H includes a large hole HL and a small hole HS. The large hole HL includes a front surface opening HF and has the shape of an inverted frustum tapering from the mask front surface 30F toward the mask back surface 30R. The small hole HS includes a back surface opening HR and has the shape of a frustum tapering from the mask back surface 30R toward the mask front surface 30F. The small hole HS connects to the large hole HL, and a section where the small hole HS connects to the large hole HL is the central opening HC. Further, mask holes 31H adjacent to each other in the first direction DR1 connect to each other at a boundary HB, which is recessed from the mask front surface 30F. As such, the thickness at the boundary HB is smaller than the thickness of the outer section 32.

Figure 10:
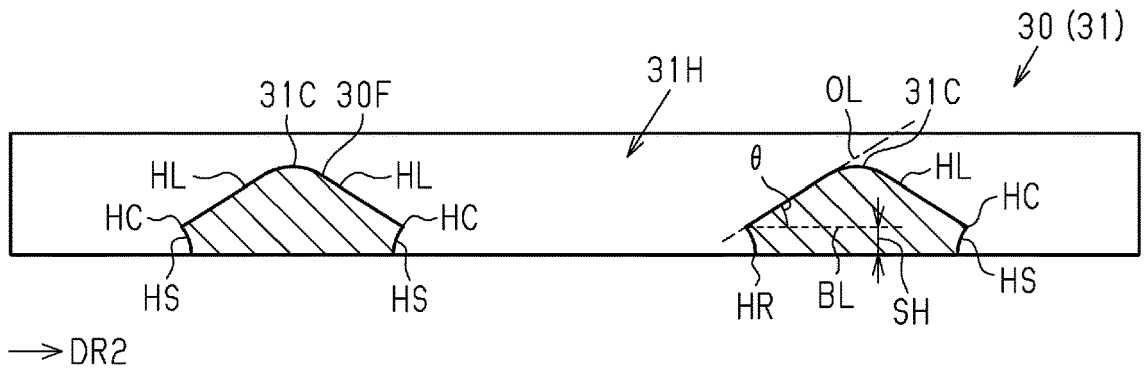
FIG. 10 is a cross-sectional end view taken along line IV-IV in FIG. 7.

FIG. 10 shows the structure as viewed in an end surface taken along line IV-IV in FIG. 7, that is, an end surface along a plane orthogonal to the mask front surface 30F and extending in the second direction DR2. In a plan view of the mask front surface 30F, line IV-IV is a straight line that extends in the second direction DR2 and passes through the centers of front surface openings HF arranged in the first direction DR1.

As shown in FIG. 10, as viewed in an end surface along a plane orthogonal to the mask front surface 30F and extending in the second direction DR2, only one auxiliary recess 31C is located between each two adjacent mask holes 31H. This auxiliary recess 31C connects to the front surface opening HF of one of the mask holes 31H and the front surface opening HF of the other mask hole 31H. That is, the mask hole 31H does not have a stepped surface with two steps. The auxiliary recess 31C connects the inner surfaces of the large holes HL of two adjacent mask holes 31H. The thickness of some sections in the mask portion 31 is smaller than the thickness of the outer section 32 by the depth of the auxiliary recess 31C.

In the same manner as the first example of a vapor deposition mask 30, in each mask hole 31H, the oblique line OL and the reference line BL form a taper angle θ. In the second example of a vapor deposition mask 30, the oblique line OL is a straight line extending along the inner surface of the large hole HL. That is, the oblique line OL is a straight line that is tangential to the central opening HC, which is the connection section between the large hole HL and the small hole HS.

[Method for Manufacturing Vapor Deposition Mask]

Referring to FIG. 11, a method for manufacturing the vapor deposition mask 30 is now described.

Figure 11A:
FIGS. 11A to 11F are process diagrams for illustrating an example of a method for manufacturing a vapor deposition mask.
Figure 11B:
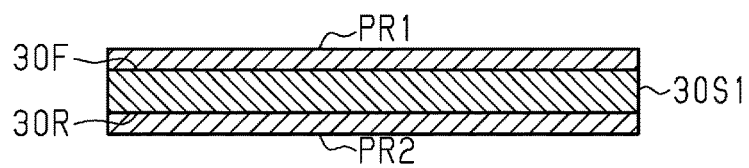
Figure 11C:
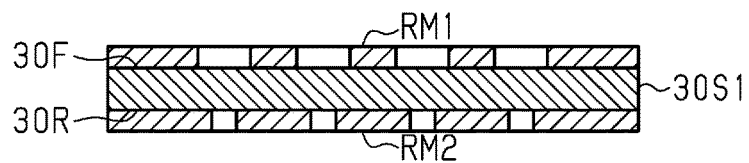

As shown in FIGS. 11A to 11F, in the method for manufacturing the vapor deposition mask 30, a sheet 30S1, which is an example of a metal plate, is first prepared (see FIG. 11A). A first resist layer PR1 is then formed on the mask front surface 30F of the sheet 30S1, and a second resist layer PR2 is formed on the mask back surface 30R of the sheet 30S1 (see FIG. 11B). Then, the first and second resist layers PR1 and PR2 are subjected to exposure and development, so that a first resist mask RM1 is formed on the mask front surface 30F and a second resist mask RM2 is formed on the mask back surface 30R (see FIG. 11C).

Figure 11D:
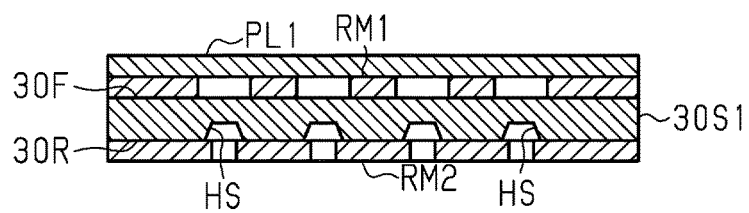
Figure 11E:
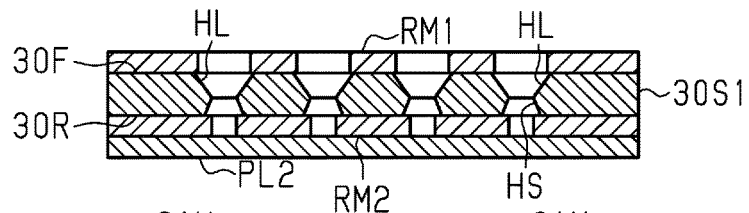
Figure 11F:
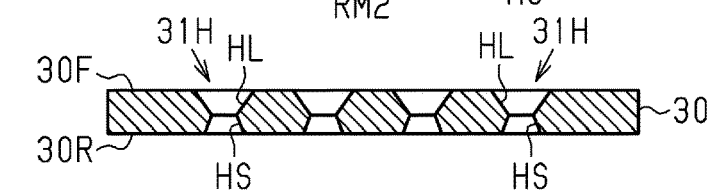

After a first protective layer PL1 is formed to cover the first resist mask RM1, the sheet 30S1 is wet-etched from the mask back surface 30R using the second resist mask RM2, thereby forming small holes HS in the sheet 30S1 (see FIG. 11D). Then, after the first protective layer PL1 is removed and a second protective layer PL2 is formed to cover the second resist mask RM2, the sheet 30S1 is wet-etched from the mask front surface 30F using the first resist mask RM1, thereby forming large holes HL in the sheet 30S1 (see FIG. 11E). The step of forming the small holes HS and the step of forming the large holes HL in the sheet 30S1 are included in the plate forming step and the mask forming step. Then, the first resist mask RM1, the second resist mask RM2, and the second protective layer PL2 are removed from the sheet 30S1, completing the vapor deposition mask 30 (see FIG. 11F). In the step shown in FIG. 11D, the second protective layer PL2 may be formed after the first resist mask RM1 is peeled off.

Electrolysis or rolling is used to produce the sheet 30S1, and the obtained sheet 30S1 may be subjected to post-treatment, such as polishing or annealing. When electrolysis is used to produce the metal sheet 30S1, the metal sheet 30S1 is formed on the surface of the electrode used for electrolysis and then removed from this surface. The sheet 30S1 is thus produced. The sheet 30S1 removed from the surface of the electrode may be annealed as needed. When rolling is used to produce the sheet 30S1, a base material for producing the sheet 30S1 is rolled and then annealed to obtain the sheet 30S1. The sheet 30S1 produced by electrolysis and the sheet 30S1 produced by rolling may be thinned by wet etching using an acidic etchant.

The electrolytic bath for electrolysis contains an iron ion source, a nickel ion source, and a pH buffer. The electrolytic bath may also contain a stress relief agent, an $Fe^{3+}$ ion masking agent, and a complexing agent, for example. The electrolytic bath is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The complexing agent may be malic acid or citric acid. The electrolytic bath used for electrolysis may be an aqueous solution containing additives listed above. The electrolytic bath is adjusted using a pH adjusting agent to have a pH of between 2 and 3 inclusive, for example. The pH adjusting agent may be 5% sulfuric acid or nickel carbonate.

The conditions for electrolysis are set to achieve desired values of thickness and composition ratio of the metal sheet 30S1. These conditions include the temperature of the electrolytic bath, the current density, and the electrolysis time. The anode used in the electrolytic bath may be a pure iron plate or a nickel plate, for example. The cathode used in the electrolytic bath may be a plate of stainless steel such as SUS304. The temperature of the electrolytic bath may be between 40° C. and 60° C. inclusive. The current density may be between 1 $A/dm^2$ and 4 $A/dm^2$ inclusive.

When the base material, which is to be rolled to form the metal sheet 30S1, is formed, a deoxidizer, which may be granular aluminum or magnesium, is mixed into the constituents of the base material for rolling so as to remove the oxygen trapped in the constituents. The aluminum and magnesium are mixed into the base material as a metallic oxide such as an aluminum oxide and a magnesium oxide. While most of the metallic oxide is removed from the base material before rolling, some of the metallic oxide remains in the base material to be rolled. In this respect, a method for manufacturing the vapor deposition mask 30 using electrolysis limits mixing of the metallic oxide into the mask sheet 30S.

An acidic etchant may be used to form mask holes 31H in the sheet 30S1 by etching. When the sheet 30S1 is made of Invar, any etchant can be used that is capable of etching Invar. The acidic etchant may be a solution containing perchloric acid, hydrochloric acid, sulfuric acid, formic acid, or acetic acid mixed in a ferric perchlorate solution or a mixture of a ferric perchlorate solution and a ferric chloride solution. The mask front surface 30F may be etched by a dipping method, a spraying method, or a spinning method.

Figure 12:
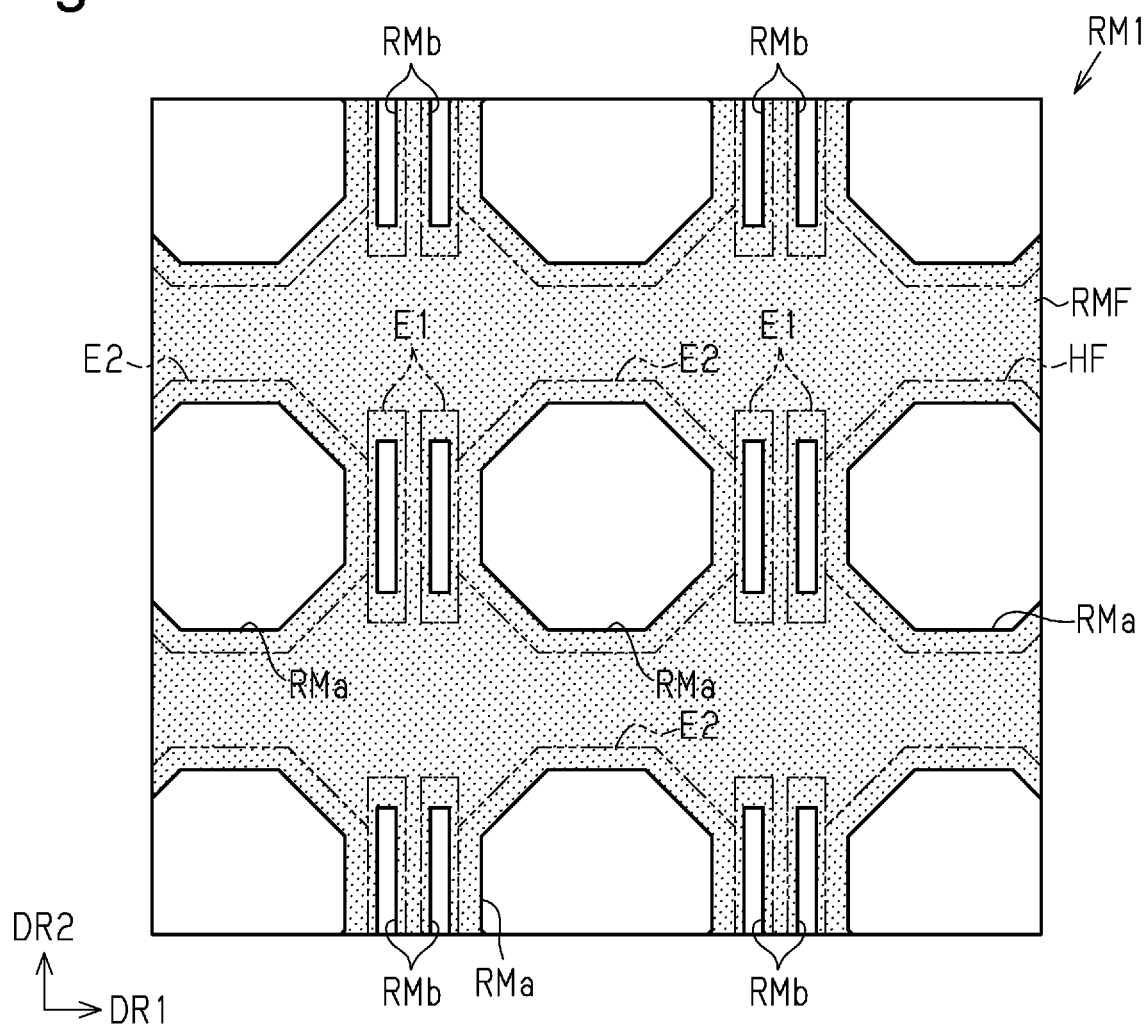
FIG. 12 is a plan view showing the structure of a first resist mask used to manufacture the first example of a vapor deposition mask.
Figure 13:
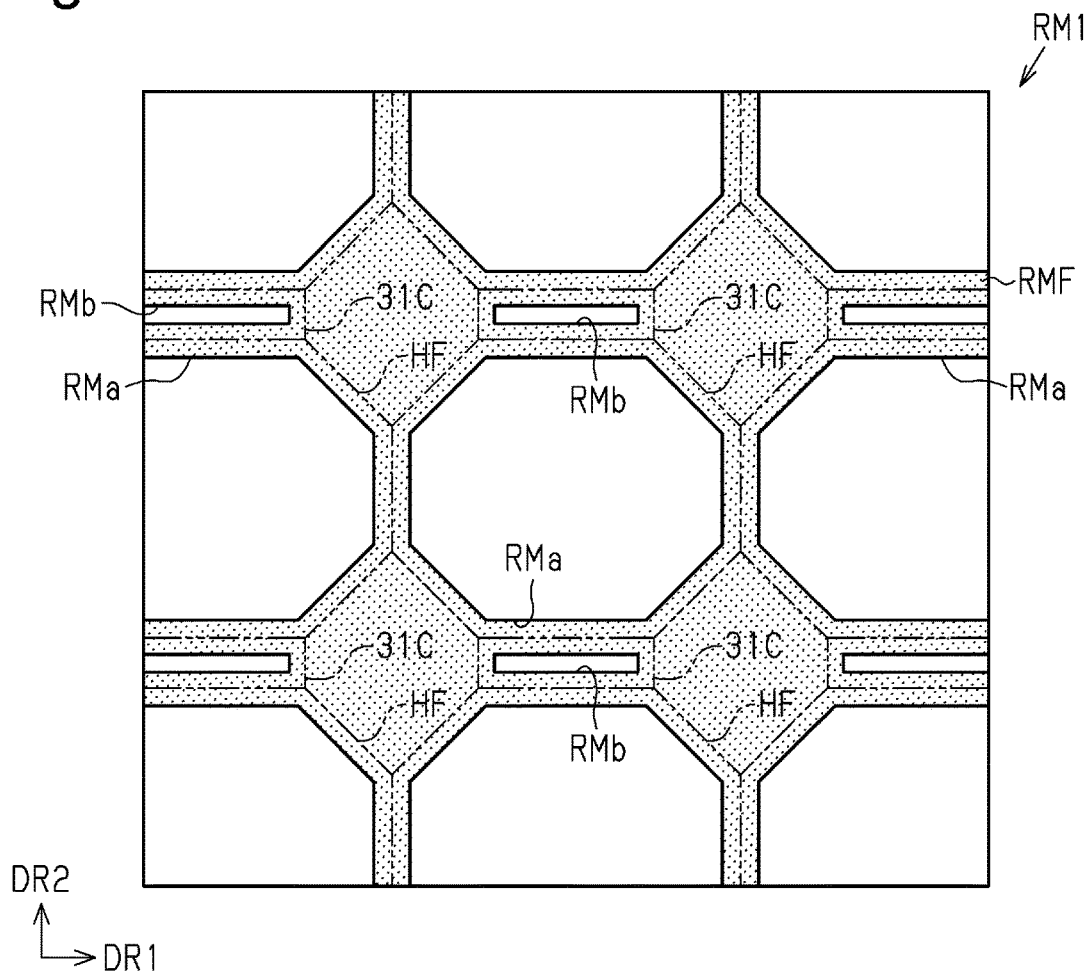
FIG. 13 is a plan view showing the structure of a first resist mask used to manufacture the second example of a vapor deposition mask.

Referring to FIGS. 12 and 13, the first resist mask RM1 is now described. FIG. 12 shows the first resist mask RM1 formed to manufacture the first example of a vapor deposition mask 30. FIG. 13 shows the first resist mask RM1 formed to manufacture the second example of a vapor deposition mask 30.

As shown in FIG. 12, the first resist mask RM1 includes a resist front surface RMF. The resist front surface RMF is a surface of the first resist mask RM1 opposite to the surface in contact with the sheet 30S1. The first resist mask RM1 has first patterns RMa and first auxiliary patterns RMb. The first patterns RMa and the first auxiliary patterns RMb extend through the first resist mask RM1 in the thickness direction of the first resist mask RM1.

In a plan view of the resist front surface RMF, each first pattern RMa substantially has a regular octagonal shape. Each first pattern RMa has a shape substantially similar to the region defined by the second section E2 of the main hole 31H1 formed by the first pattern RMa. In a plan view of the resist front surface RMF, the first patterns RMa is arranged in the first direction DR1 and the second direction DR2.

In a plan view of the resist front surface RMF, each first auxiliary pattern RMb has the shape of a rectangle extending in the second direction DR2. Each first auxiliary pattern RMb has a shape substantially similar to the region defined by the first section E1 of the auxiliary recess 31H2 formed by the first auxiliary pattern RMb. In a plan view of the resist front surface RMF, two first auxiliary patterns RMb are located between each two first patterns RMa adjacent to each other in the first direction DR1.

Etching using this first resist mask RM1 forms large holes HL, each including a main hole 31H1 and two auxiliary recesses 31H2. Small holes HS are formed using the second resist mask RM2, which has patterns in a plan view of the resist front surface RMF. The patterns of the second resist mask RM2 are substantially similar to the first patterns RMa and arranged in the first direction DR1 and the second direction DR2.

As shown in FIG. 13, the first resist mask RM1 has first patterns RMa and first auxiliary patterns RMb. The first patterns RMa and the first auxiliary patterns RMb extend through the first resist mask RM1 in the thickness direction of the first resist mask RM1.

In a plan view of the resist front surface RMF, each first pattern Rma substantially has the shape of an octagon extending in the first direction DR1. Each first pattern RMa has a shape substantially similar to the region defined by the front surface opening HF formed by the first pattern RMa.

In a plan view of the resist front surface RMF, the first patterns RMa is arranged in the first direction DR1 and the second direction DR2.

In a plan view of the resist front surface RMF, each first auxiliary pattern RMb has the shape of a rectangle extending in the first direction DR1. Each first auxiliary pattern RMb has a shape substantially similar to the region defined by the auxiliary recess 31C formed by the first auxiliary pattern RMb. In a plan view of the resist front surface RMF, one first auxiliary pattern RMb is located between each two first patterns RMa adjacent to each other in the second direction DR2.

Etching using the first resist mask RM1 forms the large holes HL and the auxiliary recesses 31C each connected to two large holes HL adjacent in the second direction DR2. Small holes HS are formed using the second resist mask RM2, which has patterns in a plan view of the resist front surface RMF. The patterns of the second resist mask RM2 are substantially similar to the first patterns RMa and arranged in the first direction DR1 and the second direction DR2.

In the method of manufacturing a display device using the vapor deposition mask 30 described above, the mask device 10 in which the vapor deposition mask 30 is set is placed in a vacuum chamber of the vapor deposition apparatus. At this time, the mask device 10 is set in the vacuum chamber such that the mask back surface 30R faces the vapor deposition target, such as a glass substrate, and that the mask front surface 30F faces the vapor deposition source. Then, the vapor deposition target is placed in the vacuum chamber of the vapor deposition apparatus, and the vapor deposition material is sublimated from the vapor deposition source. This forms a pattern of the shape corresponding to the back surface opening HR on the vapor deposition target facing the back surface opening HR. The vapor deposition material may be an organic light-emitting material for forming pixels of a display device, or a material of a pixel electrode for forming a pixel circuit of a display device, for example. The step of forming a pattern of a display device by vapor deposition using the vapor deposition mask 30 included in the mask device 10 is referred to as a pattern forming step.

EXAMPLES

An Invar sheet 30S1 having a thickness of 30 μm was prepared. Using this sheet 30S1, the following vapor deposition masks of Example 1, Example 2, Comparative Example 1, and Comparative Example 2 were produced.

Example 1

The second resist layer PR2 was exposed and developed, so that patterns each having substantially a regular octagonal shape were formed in the first direction DR1 and the second direction DR2 as viewed in a plan view of the mask back surface 30R. The first resist layer PR1 was exposed and developed, so that first patterns RMa each having substantially an octagonal shape were formed in the first direction DR1 and the second direction DR2 as viewed in a plan view of the resist front surface RMF. Further, in a plan view of the resist front surface RMF, first auxiliary patterns RMb each having the shape of a rectangle extending in the second direction DR2 were formed such that two first auxiliary patterns RMb were formed between each two first patterns RMa arranged in the first direction DR1. The first and second resist masks RM1 and RM2 were thus obtained.

Mask holes 31H were formed in the sheet 30S1 using the first and second resist masks RM1 and RM2. A vapor deposition mask 30 of Example 1 corresponding to the first example of a vapor deposition mask 30 was thus obtained. In the vapor deposition mask 30 of Example 1, the shape of each large hole HL and the dimensions of different sections were as follows.

Figure 14:
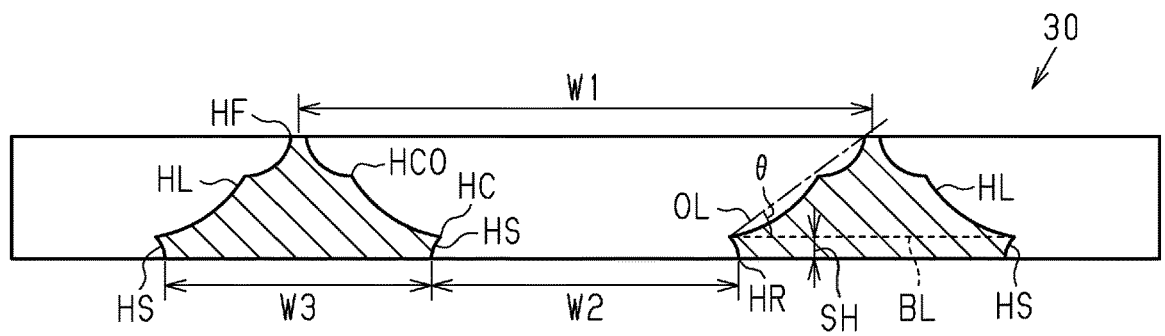
FIG. 14 is a cross-sectional end view showing the structure of the vapor deposition mask of Example 1.

As shown in FIG. 14, the inner surface of the large hole HL was observed to have two arcuate steps. In an end surface along a plane orthogonal to the mask front surface 30F and extending in the first direction DR1, the width including one large hole HL in the first direction DR1, in other words, the pitch of the large holes HL, was designated as a first width W1, and the width of a back surface opening HR in the first direction DR1 was designated as a second width W2. The width between back surface openings HR was designated as a third width W3.

In a plan view of the mask front surface 30F, a square measurement region having a side length of 2.8 mm was set on the mask portion 31, and the first width W1, the second width W2, the third width W3, the taper angle θ, and the step height SH were measured at the following thirteen positions. In the measurement region, one measurement point was set at the center of the measurement region, and two measurement points were set at opposite sides of the center of the measurement region along a straight line extending in the first direction DR1 and passing through the center of the measurement region center. Two measurement points were set at opposite sides of the center of the measurement region along a straight line extending in the second direction DR2 and passing through the center of the measurement region. In addition, on each of two diagonal lines passing through the center of the measurement region, two measurement points were set at one side of the center of the measurement region, and two measurement points were set at the other side. On the straight lines on which the measurement points are set, the distance between the two measurement points in each pair was set to the same value. In the following description, the taper angle θ of each example and comparative example is the average value of the taper angles θ obtained at the 13 measurement points. In addition, the step height SH of each example and comparison example is the average value of the step heights SH obtained at the 13 measurement points.

In the vapor deposition mask 30 of Example 1, the first width W1 was 140 μm, the second width W2 was 75 μm, the third width W3 was 65 μm, the taper angle θ was 36°, and the step height SH was 0.5 μm. Each large hole HL was observed to have stepped surfaces spreading from the central opening HC to the front surface opening HF, a main hole 31H1, and two auxiliary recesses 31H2 located on the opposite sides of the main hole 31H1 in the first direction DR1. In addition, at the same measurement points, the taper angle θ was 57° in an end surface along a plane orthogonal to the mask front surface 30F and extending in the second direction DR2.

Comparative Example 1

A vapor deposition mask 40 of Comparative Example 1 was produced using the same method as Example 1 except that the first resist mask RM1 had only first patterns RMa.

Figure 15:
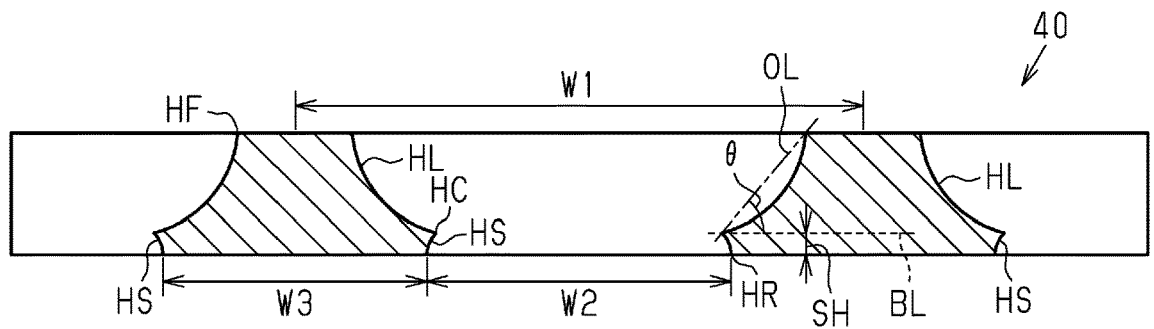
FIG. 15 is a cross-sectional end view showing the structure of the vapor deposition mask of Comparative Example 1.

As shown in FIG. 15, in the vapor deposition mask 40 of Comparative Example 1, the first width W1, the second width W2, the third width W3, and the step height SH had the same values as the vapor deposition mask 30 of Example 1. However, the taper angle θ was 55° in the vapor deposition mask 40 of Comparative Example 1. These values were measured under the same conditions as Example 1. In addition, although the inner surface of each mask hole was arcuate, the inner surface did not include a stepped surface. Further, at the same measurement points, the taper angle θ was 57° in an end surface along a plane orthogonal to the mask front surface 30F and extending in the second direction DR2.

Example 2

A vapor deposition mask 30 of Example 2 was produced using the same method as Example 1 except that the first patterns RMa and the first auxiliary patterns RMb of the first resist mask RM1 were modified as follows. That is, the first patterns RMa each substantially having the shape of an octagon extending in the first direction DR1 was formed in the first resist mask RM1 and arranged in the first direction DR1 and the second direction DR2 in a plan view of the resist front surface RMF. Further, in a plan view of the resist front surface RMF, one first auxiliary pattern RMb having the shape of a rectangle extending in the first direction DR1 was formed between each two first patterns RMa adjacent to each other in the second direction DR2. The vapor deposition mask 30 of Example 2 corresponds to the second example of a vapor deposition mask 30.

Figure 16:
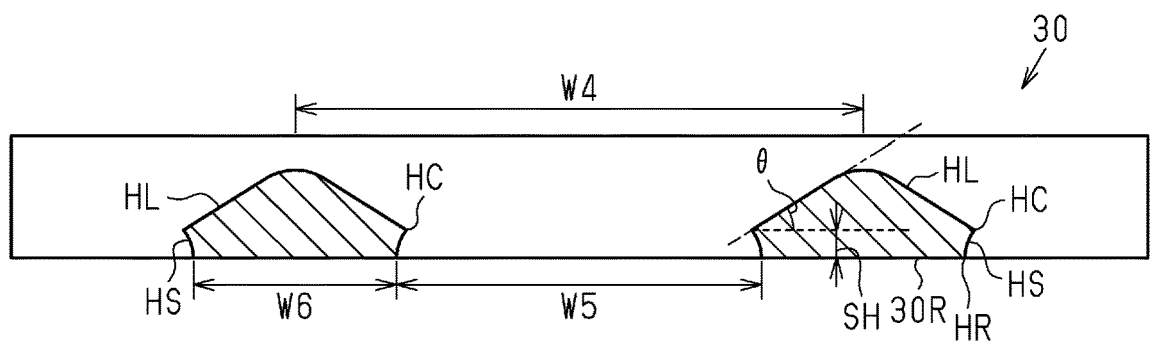
FIG. 16 is a cross-sectional end view showing the structure of the vapor deposition mask of Example 2.

As shown in FIG. 16, in a cross-section along a plane orthogonal to the mask front surface 30F and extending in the second direction DR2, the width including one large hole HL in the second direction DR2, in other words, the pitch of the large holes HL was designated as a fourth width W4, and the width of the back surface opening HR in the second direction DR2 was designated as a fifth width W5. The width between the back surface openings HR was designated as a sixth width W6.

In the vapor deposition mask 30 of Example 2, the fourth width W4 was 140 μm, the fifth width W5 was 90 μm, the sixth width W6 was 50 μm, the taper angle θ was 36°, and the step height SH was 0.6 μm. These values were measured under the same conditions as Example 1. In a plan view of the mask front surface 30F, an auxiliary recess 31C was observed between each two front surface openings HF adjacent to each other in the second direction DR2. The auxiliary recesses 31C were connected to the respective front surface openings HF. In addition, at the same measurement points, the taper angle θ was 33° in an end surface along a plane orthogonal to the mask front surface 30F and extending in the first direction DR1.

Comparative Example 2

A vapor deposition mask 50 of Comparative Example 2 was produced using the same method as Example 2 except that the first resist mask RM1 had only first patterns RMa.

Figure 17:
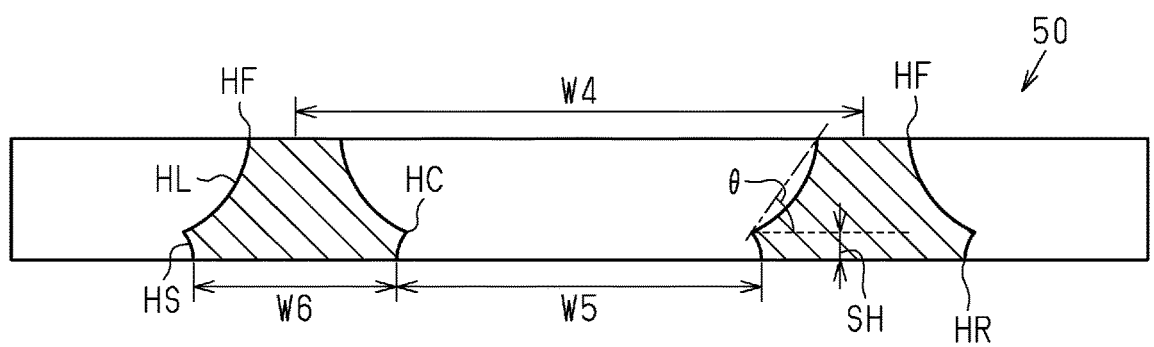
FIG. 17 is a cross-sectional end view showing the structure of the vapor deposition mask of Comparative Example 2.

As shown in FIG. 17, in the vapor deposition mask 50 of Comparative Example 2, the fourth width W4, the fifth width W5, the sixth width W6, and the step height SH had the same values as the vapor deposition mask 30 of Example 2. However, the taper angle θ was 58° in the vapor deposition mask 50 of Comparative Example 2. These values were measured under the same conditions as Example 1. In a plan view of the mask front surface, although front surface openings were observed, no auxiliary recess was observed between two front surface openings. In addition, at the same measurement points, the taper angle θ was 32° in an end surface along a plane orthogonal to the mask front surface 30F and extending in the first direction DR1.

[Evaluation]

As described above, the vapor deposition mask 30 in which each large hole HL had a main hole 31H1 and auxiliary recesses 31H2 was verified to have a smaller taper angle θ than the vapor deposition mask 40 without auxiliary recesses. Further, the vapor deposition mask 30 that had auxiliary recesses 31C between two large holes HL was verified to have a smaller taper angle θ than the vapor deposition mask 50 without auxiliary recesses 31C. That is, the vapor deposition mask 30 had a small taper angle θ and was therefore verified to reduce limitations on the incident angle of vapor deposition particles at which the vapor deposition particles can pass through the mask hole 31H.

The above-described embodiment has the following advantages.

(1) The stepped surfaces that spread enlarge the edge E of the front surface opening HF. This allows the taper angle θ to be smaller than that of a mask hole 31H without the stepped surface. This reduces limitations on the incident angle of vapor deposition particles at which the vapor deposition particles can pass through the mask hole 31H.

(2) Since the stepped surfaces are arcuate in a cross-section orthogonal to the front surface, the steps can be formed by wet etching in a suitable manner.

(3) Sections in the edge E of each front surface opening HF connect to auxiliary recesses 31C and thus are recessed from the mask front surface 30F. This allows the taper angle θ to be smaller than that of a mask hole 31H without the auxiliary recesses 31C. This reduces limitations on the incident angle of vapor deposition particles at which the vapor deposition particles can pass through the mask hole 31H.

(4) Each boundary HB in the edge E of the front surface opening HF is recessed from the mask front surface 30F. As such, regions other than the auxiliary recesses 31C can also have a smaller taper angle θ than a configuration without the boundary HB.

(5) In the section where the distance between adjacent central openings HC is smallest, the boundary HB provides a taper angle θ. In the section where the distance between adjacent central openings HC is larger, the auxiliary recess 31C provides a small taper angle θ. Thus, a small taper angle θ is achievable even in a design with a greater distance between adjacent central openings HC.

The above-described embodiment may be modified as follows.

[First Modification]

Figure 18:
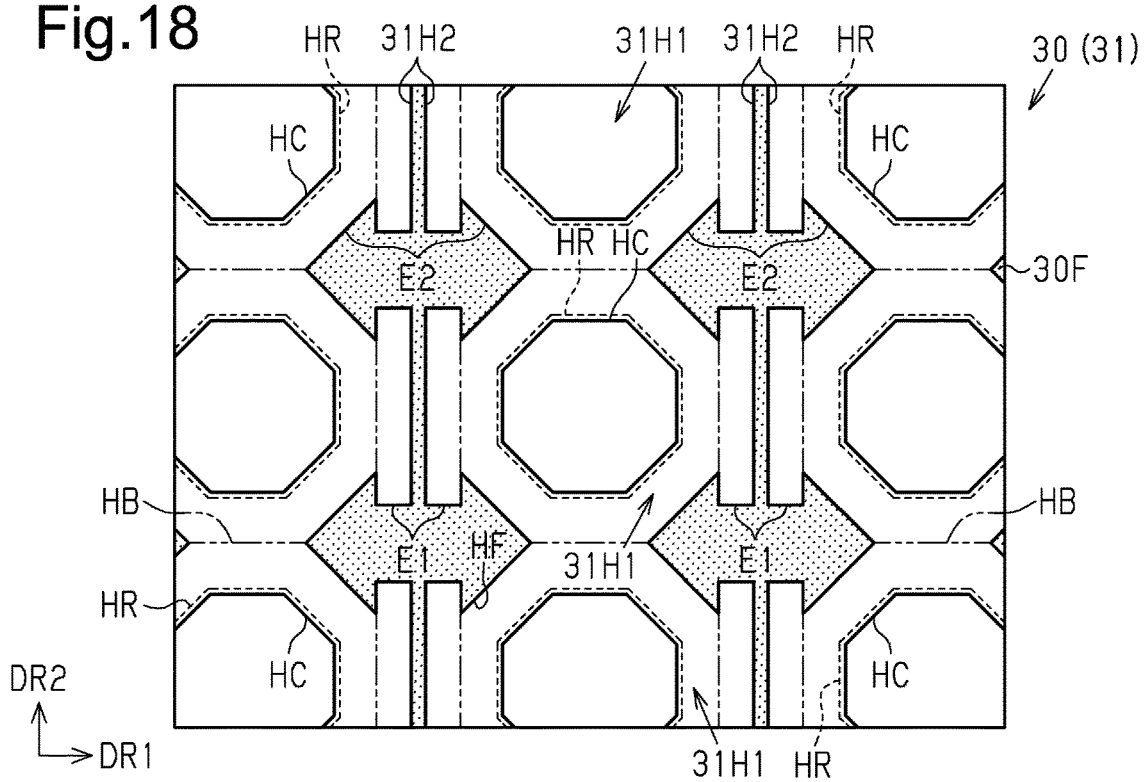
FIG. 18 is a plan view showing the structure of the mask front surface of a vapor deposition mask of a modification.

As shown in FIG. 18, each second section E2 of the edge E of each front surface opening HF may include a boundary HB that coincides with the second section E2 of another front surface opening HF that is adjacent to the front surface opening HF, and the boundary HB may be recessed from the mask front surface 30F. That is, the mask holes 31H of the first example of a vapor deposition mask 30 may include boundaries HB equivalent to the boundaries HB of the second example of a vapor deposition mask 30. This structure has the following advantage.

(6) Since the boundaries HB in the edge E of the front surface opening HF are recessed from the mask front surface 30F, regions other than the stepped surfaces can also have a smaller taper angle θ than a configuration without the boundary HB.

In the configuration in which the mask holes 31H include the boundaries HB, each boundary HB may include a section around the central opening HC where the distance between adjacent central openings HC is smallest in a plan view of the mask front surface 30F. That is, in the first example of a vapor deposition mask 30, the first distance D1 may be smaller than the second distance D2, and two mask holes 31H adjacent in the first direction DR1 may form a boundary HB in the same manner as the second example of a vapor deposition mask 30. This structure has the following advantage.

(7) In the region where the distance between adjacent central openings HC is smallest, the boundary HB provides a small taper angle θ. In the section where the distance between adjacent central openings HC is larger, the stepped surface provides a small taper angle θ. Thus, a small taper angle θ is achievable even in a design with a greater distance between adjacent central openings HC.

Figure 19:
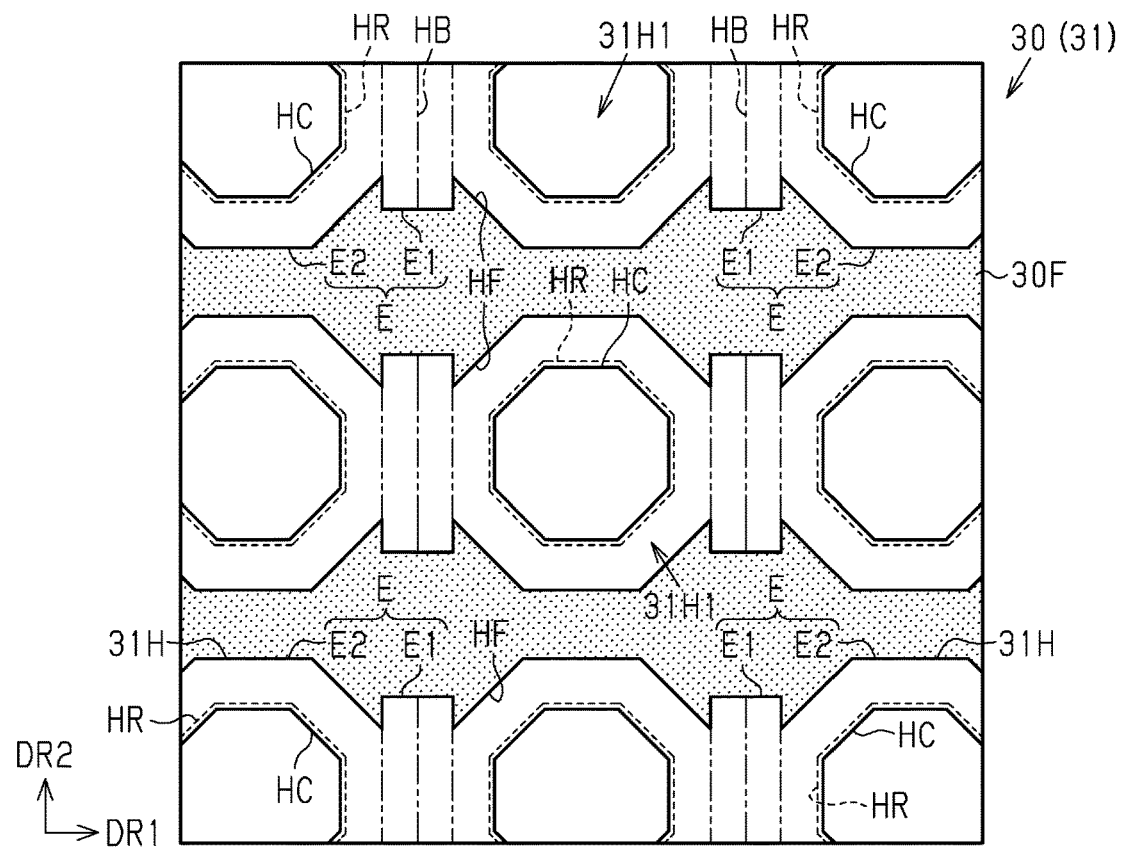
FIG. 19 is a plan view showing the structure of the mask front surface of a vapor deposition mask of a modification.

As shown in FIG. 19, each first section E1 in the edge E of each front surface opening HF may include a boundary HB that coincides with the first section E1 of another front surface opening HF that is adjacent to the front surface opening HF, and the boundary HB may be recessed from the mask front surface 30F. That is, the edge of an auxiliary recess 31H2 of one front surface opening HF may coincide with the edge of an auxiliary recess 31H2 of another front surface opening HF that is adjacent to the front surface opening HF in the first direction DR1 so as to form a boundary HB. In other words, each boundary HB in the second example of a vapor deposition mask 30 may be formed between two auxiliary recesses 31H2 adjacent to each other in the first direction DR1. This structure has the following advantage.

(8) The boundaries HB in the edge E of the front surface opening HF are recessed from the mask front surface 30F. This allows the taper angle θ to be smaller than that in a configuration without the boundary HB.

Each mask hole 31H may have a recess between the mask hole 31H and a mask hole 31H adjacent in the second direction DR2 in a plan view of the mask front surface 30F. In this configuration, each mask hole 31H may have one recess, or may have two recesses at opposite sides of the front surface opening HF in the second direction DR2. This configuration achieves an advantage equivalent to Advantage (1) in the second direction DR2.

The inner surface of each mask hole 31H may have a stepped surface extending over the entire circumference of the front surface opening HF. To form a stepped surface extending over the entire circumference of the front surface opening HF, a first auxiliary pattern extending over the entire circumference of the first pattern RMa is formed in the first resist mask RM1, and an annular auxiliary recess extending over the entire circumference of the front surface opening HF is formed.

The central openings HC may be located at the mask back surface 30R. In other words, each mask hole 31H may be configured to include a front surface opening HF and a back surface opening HR but not a central opening HC. In this case, the front surface opening HF is an example of a large opening, and the back surface opening HR is an example of a small opening. That is, each mask hole 31H may be configured to include the inner surface of the large hole HL but not the inner surface of the small hole HS. In this configuration, of the straight lines each connecting the edge of the back surface opening HR to one point on the inner surface of the large hole HL, the straight line that forms the largest angle with the reference line BL is the oblique line OL. This configuration has the following advantage.

(9) Since the back surface opening HR, which is an example of the small opening, is located at the mask back surface 30R, the processing only from mask front surface 30F achieves the processing from the front surface opening HF to the back surface opening HR.

[Second Modification]

Each mask hole 31H does not have to include the boundary HB. In other words, in a plan view of the mask front surface 30F, the mask holes 31H adjacent to each other in the first direction DR1 may be spaced apart from each other.

The distance between mask holes 31H in the first direction DR1 may be equal to the distance between mask holes 31H in the second direction DR2.

The central openings HC may be located at the mask back surface 30R. In other words, each mask hole 31H may be configured to include a front surface opening HF and a back surface opening HR but not a central opening HC. In this case, the front surface opening HF is an example of a large opening, and the back surface opening HR is an example of a small opening. That is, each mask hole 31H may be configured to include the inner surface of the large hole HL but not the inner surface of the small hole HS. In this configuration, of the straight lines each connecting the edge of the back surface opening HR to one point on the inner surface of the large hole HL, the straight line that forms the largest angle with the reference line BL is the oblique line OL. This configuration achieves an advantage equivalent to Advantage (9).

[Other Modifications]

The vapor deposition mask 30 may include at least one mask portion and a mask frame having a rectangular frame shape surrounding the mask portion, and the mask portion may be joined to the mask frame. In this configuration, mask holes are formed in the mask portion.

Mask holes 31H may be formed in the sheet 30S1 by irradiating the sheet 30S1 with a laser beam.

DESCRIPTION OF THE REFERENCE NUMERALS

10 . . . Mask Device; 20 . . . Main Frame; 21 . . . Main Frame Hole; 30, 40, 50 . . . Vapor Deposition Mask; 30F . . . Mask Front Surface, 30R . . . Mask Back Surface; 30S . . . Mask Sheet, 30S1 . . . Sheet; 31 . . . Mask Portion; 31C, 31H2 . . . Auxiliary Recess; 31H . . . Mask Hole; 31H1 . . . Main Hole; 32 . . . Outer Section; C1 . . . First Center Of Curvature; C2 . . . Second Center Of Curvature; CA . . . Arcuate Section; CA1 . . . First Arc; CA2 . . . Second Arc; CC1 . . . First Curvature Circle, CC2 . . . Second Curvature Circle; E . . . Edge, E1 . . . First Section; E2 . . . Second Section; HB . . . Boundary; HC . . . Central Opening; HCO . . . Connection Section; HF . . . Front Surface Opening; HL . . . Large Hole; HR . . . Back Surface Opening; HS . . . Small Hole; PL1 . . . First Protective Layer; PL2 . . . Second Protective Layer; PR1 . . . First Resist Layer; PR2 . . . Second Resist Layer; RC1 . . . First Curvature Radius; RC2 . . . Second Curvature Radius; RM1 . . . First Resist Mask; RM2 . . . Second Resist Mask; Rma . . . First Pattern; Rmb . . . First Auxiliary Pattern; RMF . . . Resist Front Surface; SH . . . Step Height

The invention claimed is:

1. A vapor deposition mask including a metal plate and a plurality of mask holes in the metal plate, the vapor deposition mask comprising:
a front surface;
a back surface opposite to the front surface; and
inner surfaces defining respective ones of the plurality of mask holes, wherein
each of the plurality of mask holes extends between the front surface and the back surface, in a plan view of the front surface, each of the plurality of mask holes includes a first opening, which is located at the front surface, and a second, smaller opening, which is located inside the first opening, at least a section of each of the plurality of mask holes has a shape of an inverted frustum extending between the first opening and the second, smaller opening, and each of the inner surfaces includes an arcuate stepped surface comprising a plurality of steps spreading from the second, smaller opening toward the first opening as viewed in a cross-section orthogonal to the front surface, the arcuate stepped surface has two steps, as viewed in a cross-section orthogonal to the front surface, the arcuate stepped surface has an arcuate section having two arcuate steps, the arcuate section includes a first arc and a second arc that is located closer to the mask back surface than the first arc, the first arc has a first curvature radius and the second arc has a second, larger curvature radius, as viewed in the cross-section the second arc has a center of curvature, the center of curvature is outside the first opening in the thickness direction of the metal plate.

2. The vapor deposition mask according to claim 1, wherein each of the first openings has an edge that includes a first section, which is an edge of the arcuate stepped surface, and a second section, which is a section other than the first section, the second section of the edge of each of the first openings includes a boundary that coincides with the second section of one of the first openings that is adjacent to the first opening, and the boundary is recessed from the front surface.

3. The vapor deposition mask according to claim 2, wherein in a plan view of the front surface, each boundary includes a section around a corresponding one of the plurality of second openings where a distance between the corresponding second opening and an adjacent one of the second openings is smallest.

4. The vapor deposition mask according to claim 1, wherein each of the first openings has an edge that includes a first section, which is an edge of the arcuate stepped surface, and a second section, which is a section other than the first section, the first section of the edge of each of the first openings includes a boundary that coincides with the first section of another of the first openings that is adjacent to the first opening, and the boundary is recessed from the front surface.

5. The vapor deposition mask according to claim 1, wherein each of the second, smaller openings is located at the back surface.

6. The vapor deposition mask according to claim 1, wherein a distance between the second, smaller opening and the back surface is less than or equal to 3 μm.

7. A method for manufacturing a vapor deposition mask according to claim 1 including a metal plate and a plurality of mask holes in the metal plate, the method comprising:

forming a vapor deposition mask by forming the plurality of mask holes in the metal plate, wherein the vapor deposition mask includes:
a front surface;
a back surface opposite to the front surface; and
inner surfaces defining respective ones of the plurality of mask holes, each of the plurality of mask holes extends between the front surface and the back surface, in a plan view of the front surface, each of the plurality of mask holes includes a first opening, which is located at the front surface, and a second, smaller opening, which is located inside the first opening, at least a section of each of the plurality of mask holes has a shape of an inverted frustum extending between the first opening and the second, smaller opening, and each inner surface includes an arcuate stepped surface spreading from the second, smaller opening toward the first opening as viewed in a cross-section orthogonal to the front surface, the arcuate stepped surface has two steps, as viewed in a cross-section orthogonal to the front surface, the arcuate stepped surface has an arcuate section having two arcuate steps, the arcuate section includes a first arc and a second arc that is located closer to the mask back surface than the first arc, the first arc has a first curvature radius and the second arc has a second, larger curvature radius, as viewed in the cross-section the second arc has a center of curvature, the center of curvature is outside the first opening in the thickness direction of the metal plate, forming a vapor deposition mask includes forming a resist mask on the metal plate and forming the stepped surface by etching once using the resist mask, the resist mask includes a resist front surface that is a surface of the resist mask opposite to the surface in contact with the metal plate, a first pattern to form the second arc and a second pattern to form the first arc, the first pattern and the second pattern extend through the resist mask in the thickness direction of the resist mask, as viewed in a plan view of the resist front surface, two of the second patterns are located on the opposite sides of the first pattern.

8. The vapor deposition mask according to claim 7, wherein a distance between the second, smaller opening and the back surface is less than or equal to 3 μm.

* * * * *